United States Patent
Gardner et al.

(10) Patent No.: US 6,403,445 B1
(45) Date of Patent: Jun. 11, 2002

(54) ENHANCED TRENCH ISOLATION STRUCTURE

(75) Inventors: Mark I. Gardner, Cedar Creek; Frederick N. Hause, Austin, both of TX (US); Charles E. May, Gresham, OR (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/286,729

(22) Filed: Apr. 6, 1999

(51) Int. Cl.[7] .............................................. H01L 21/762
(52) U.S. Cl. ....................... 438/424; 438/221; 438/432; 438/764
(58) Field of Search ................................. 438/405, 424, 438/427, 764, 218, 221

(56) References Cited

U.S. PATENT DOCUMENTS

| | | | |
|---|---|---|---|
| 4,744,863 A | * | 5/1988 | Guckel et al. ................. 438/53 |
| 5,665,635 A | * | 9/1997 | Kwon et al. ................. 438/427 |
| 5,728,621 A | * | 3/1998 | Zheng et al. ................. 438/427 |
| 5,877,057 A | * | 3/1999 | Gardner et al. ............. 438/301 |
| 5,888,853 A | * | 3/1999 | Gardner et al. ............. 438/152 |
| 5,899,719 A | * | 3/1999 | Hong .......................... 438/289 |
| 5,923,992 A | * | 7/1999 | Spikes et al. ................ 438/424 |
| 6,103,593 A | * | 8/2000 | Hui et al. .................... 438/427 |

OTHER PUBLICATIONS

Ibok et al. "Material, Fractural and Optical Properties of PECVD Nitride and Oxynitride Films" Electrochemical Society Extended Abstract #776, pp. 963–964, vol. 96–1 (1996).*

Wolf et al. "Silicon Processing for the VLSI Era" vol. 1 Lattice Press, 1986, p. 194.*

* cited by examiner

Primary Examiner—Olik Chaudhuri
Assistant Examiner—Anh Duy Mai
(74) Attorney, Agent, or Firm—Zagorin, O'Brien & Graham, LLP

(57) ABSTRACT

An improved method of trench isolation formation includes, for one embodiment, applying a polysilicon layer above a planarized trench, and converting the polysilicon to oxide prior to etching the active areas. This converted oxide is denser than the materials usually used to fill the trench, such as TEOS, and results in less over-etching of the trench isolation region. The quality of the dielectric isolation is consequently improved, and in particular, less leakage current flows across the trench isolation region. Moreover, less leakage current flows from a subsequently formed local interconnect layer.

43 Claims, 4 Drawing Sheets

ENHANCED TRENCH ISOLATION STRUCTURE

BACKGROUND OF THE INVENTION

In the processing of semiconductor devices, dielectric isolation is increasingly used rather than junction isolation for increasing the packing density of resultant structures and for providing physical separation of dissimilar devices. Moreover, trench isolation is used, particularly with planarization techniques such as chemical-mechanical polishing (CMP), to provide for a small, yet very electrically effective dielectric isolation region, and yet still affords a planar structure for facilitating subsequent formation of fine-pitch interconnect lines.

Frequently, tetra-ethyl-ortho-silicate (TEOS) is the dielectric material used to fill a trench previously etched into the surface of the substrate, and the surface of the TEOS trench is planarized with the silicon substrate surface by chemical-mechanical polishing.

Referring to FIG. 1A, two trench isolation regions 102 are shown formed within a semiconductor substrate 100. An active area 103 (for later formation of a device, such as a field effect transistor) is shown located between the two trench isolation regions 102. The surfaces (labeled as 105) of the trench isolation regions 102 are shown as having been planarized with the surface (labeled as 104) of the active area 103, as is well known in the art of trench formation.

The various etches used to clean the silicon surface in the active areas (such as active area surface 104) are also usually applied to the trench isolation region surface 105. Because the etch rate of common trench fill materials, such as TEOS, is frequently greater than the etch rate of various substrate materials (such as single crystal silicon), a significant over-etching of the trench regions 102 occurs. This over-etching creates a recessed trench fill surface 106, as shown in FIG. 1B, which leads to degraded electrical performance of the dielectric isolation provided by the trench. Such degraded performance includes increased leakage currents along the edges of the recessed TEOS trench.

SUMMARY OF THE INVENTION

An improved method of trench isolation formation includes applying a polysilicon layer above a planarized trench, and converting the polysilicon to oxide prior to etching the active areas. This converted oxide is denser than the materials usually used to fill the trench, such as TEOS, and results in less over-etching of the trench isolation region. The quality of the dielectric isolation is consequently improved, and in particular, less leakage current flows across the trench isolation region. Moreover, less leakage current flows from a subsequently formed local interconnect layer.

In one embodiment of the present invention, a method of forming an integrated circuit structure upon a semiconductor substrate having a top surface includes forming a plurality of trench isolation regions, each filled with a trench dielectric material, at the top surface of the semiconductor substrate, the trench isolation regions defining active area regions therebetween; forming a protective layer over and fully covering the trench isolation regions; and then removing material overlying the active area regions to expose the top surface of the semiconductor substrate within the active area regions; wherein the protective layer remains over the trench isolation regions during at least a portion of the removing step to protect the trench isolation regions and to reduce removal of trench dielectric material during the removing step; and then forming a gate dielectric layer on the exposed top surface within the active area regions; and forming a gate electrode over the gate dielectric layer within an active area region.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 1A:
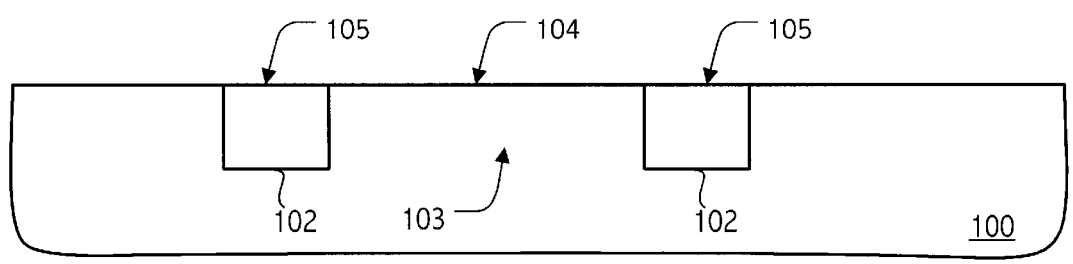
FIGS. 1A–1B, labeled prior art, are a sequence of cross-sections of a semiconductor body illustrating the recessed trench which results from over-etching a planarized trench isolation region during etching of the active areas.
Figure 1B:
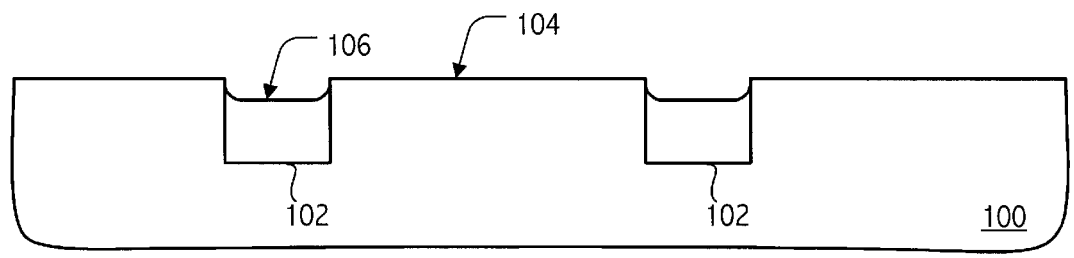
Figure 2A:
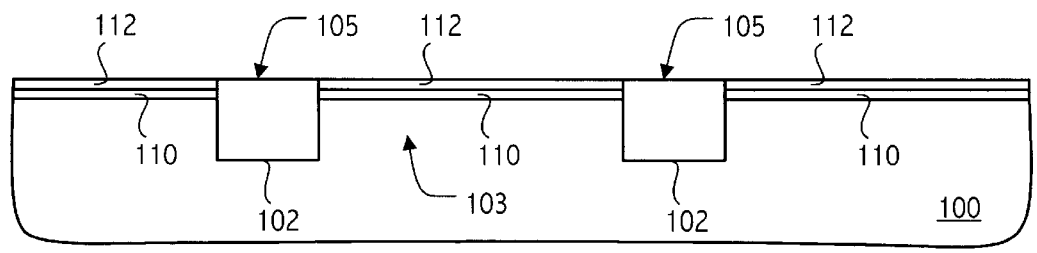
FIGS. 2A–2G are a sequence of cross-sections of a semiconductor body illustrating an improved semiconductor process flow, in accordance with one embodiment of the present invention, for creating a trench isolation region.

Referring now to FIG. 2A, two trench isolation regions 102 are shown formed within a semiconductor substrate 100. Such a substrate 100 may be a wafer, an epitaxial layer formed upon a wafer, a re-crystallized layer formed upon a non-conductive layer or wafer, or any other suitable material in which devices are to be formed and isolation between devices is desired. To form the trench isolation regions, a pad oxide layer 110 is formed upon the surface of the substrate 100, either by deposition or by oxidation, and then a nitride layer 112 is formed, usually by deposition, upon the pad oxide layer 110. Openings are defined within the nitride layer 112 by masking a photoresist layer (not shown) to pattern the photoresist layer, then by etching nitride openings corresponding to the locations where the trench isolation regions are desired, using the patterned photoresist layer as a mask. Then, after removing the patterned photoresist layer, the patterned nitride layer 112 is used as a mask to first etch the pad oxide layer 110 and then to etch the substrate 100, thereby creating trenches within the substrate 100. After a brief oxidation to line the trench walls (not shown), the trench is filled with, for example, TEOS, and then planarized using CMP to the top surface of the nitride layer 112. The resulting structure is shown in FIG. 2A. An active area 103 is shown located between two trench isolation regions 102. The surfaces (labeled as 105) of the trench isolation regions 102 are shown as having been planarized with the surface of the nitride layer 112. The pad oxide layer 110 may be 20–100 Å thick, while the nitride layer 112 may be 500–1500 Å thick.

Figure 2B:
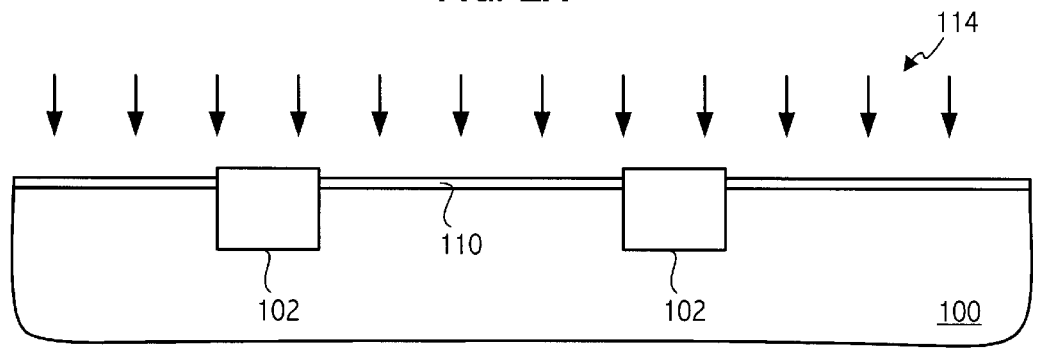

Referring now to FIG. 2B, the remaining portions of the nitride layer 112 are stripped from the surface, and then a variety of implants are performed (collectively represented by implant 114) to provide for proper doping of the various active areas. Such implants 114 include, for example, a $V_T$ (threshold) implant, a punch-through implant, and well implants for both wells (e.g., for a CMOS process). The required photoresist masking and the detailed process flows for such various implants is well known in the art, and is not discussed in detail herein.

Figure 2C:
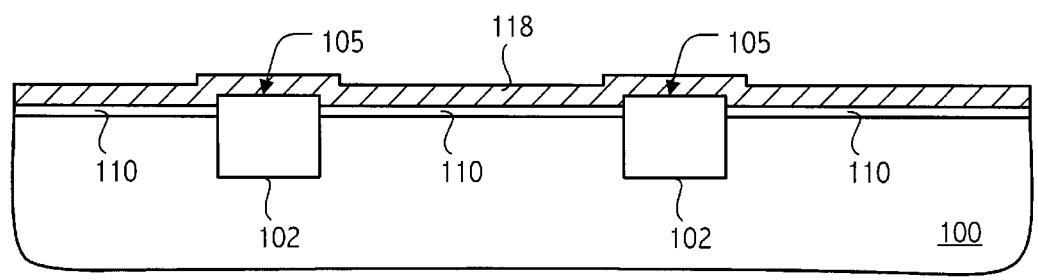

Referring now to FIG. 2C, a polysilicon layer 118 is formed upon the surface of the semiconductor body, which at this point in the process flow includes the surface 105 of the trench isolation regions 102, and the surface of the remaining portions of the pad oxide layer 110. The polysilicon layer 118 is formed to a thickness of preferably 150–300 Å, by any of a variety of suitable polysilicon formation techniques, and may be formed into an amorphous state if processed below about 580° C., or may be formed into a poly-crystalline state if processed above about 600° C. The polysilicon layer 118 is preferably formed by the decomposition of silane gas, into which a gaseous source of nitrogen has been added. If processed at about 620° C., the resultant deposition rate is approximately 40 Å per minute.

Figure 2D:
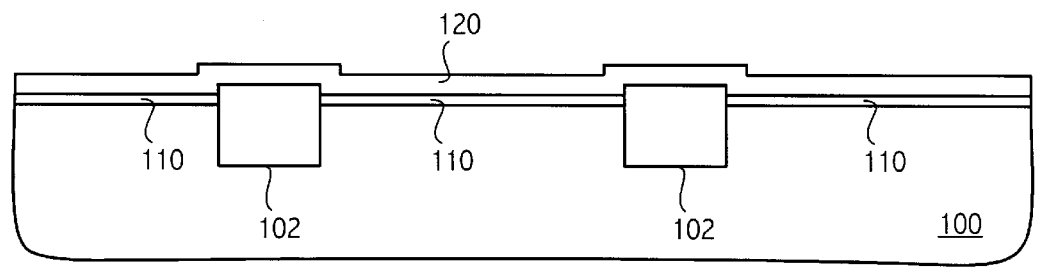

This polysilicon layer 118 is then converted into an oxide, preferably in a manner resulting in nitrogen incorporated within at least the upper portion of the resultant oxide layer. For example, a source of nitrogen may be provided within an oxidizing ambient used to convert the polysilicon to oxide. Alternatively, nitrogen may be provided during a final anneal of the formed oxide or by a plasma treatment of the oxide. In particular, the resultant oxide may be RTA annealed (i.e., "rapid thermal anneal") in a nitrogen-bearing ambient (e.g., NO, $N_2O$, $N_2$, $NH_3$, or others) to incorporate nitrogen within the converted oxide. The resultant structure is shown in FIG. 2D, which shows a converted poly oxide layer 120 now formed upon the remaining portions of the pad oxide layer 110 and further upon the trench isolation regions 102.

The conversion of polysilicon layer 118 into the converted poly oxide layer 120 results in a dense oxide directly on top of the trench isolation regions. The addition of nitrogen into at least the upper portion of the converted poly oxide layer 120 results in a particularly high-quality dense oxide above the active areas (e.g., active area 103) and above the trench isolation regions 102. Such a dense oxide etches more slowly than less dense oxides or other dielectrics, particularly TEOS. Preferably a nitrogen-bearing layer is formed in at least the upper portion of the converted poly oxide layer 120 having a 3–5% concentration of nitrogen within the top 50 Angstroms of the nitrogen-bearing layer.

Figure 2E:
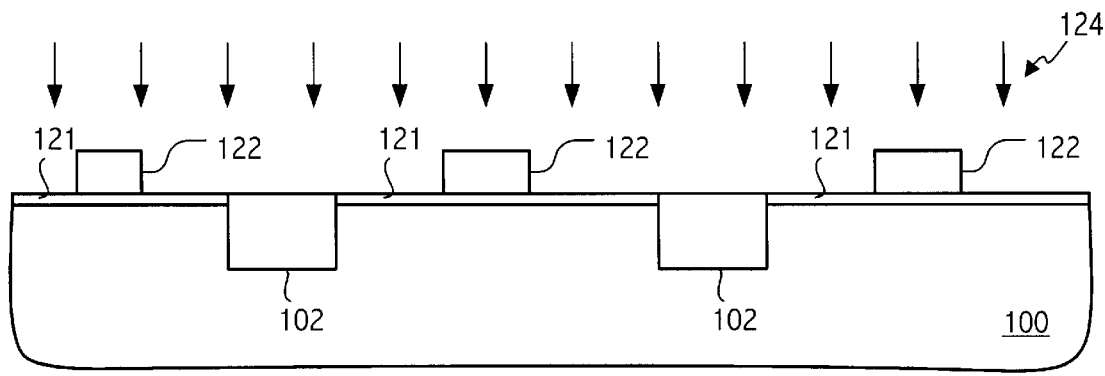
Figure 2F:
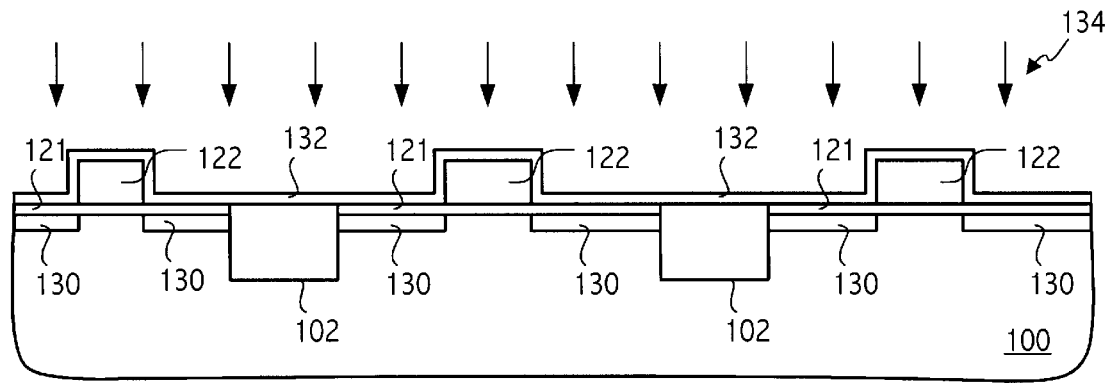
Figure 2G:
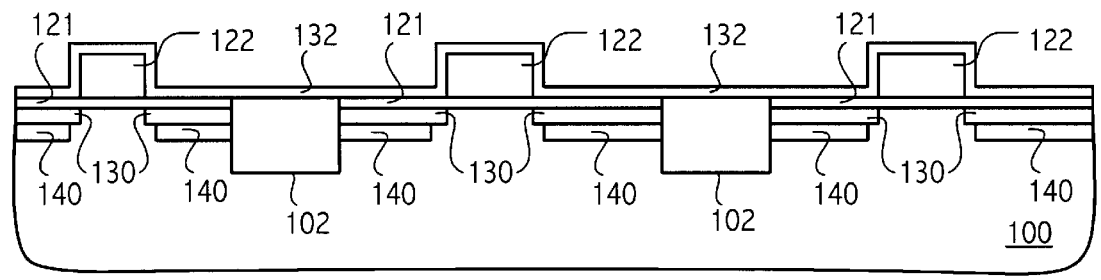

Continuing with the process flow, the converted poly oxide layer 120 is then etched to expose the active area surface prior to gate oxidation. This high-quality, dense oxide layer 120 protects the trench isolation regions 102 from the over-etch effects of this "pre-gate" etch step when applied to the active areas. The actual top surface of the trench isolation regions 102 is exposed to the etch only near the end of the etch step, rather than exposed entirely during the etch step. Referring now to FIG. 2E, a gate dielectric layer 121 is formed on the exposed active area surface, and then gate electrodes 122 are formed, typically by depositing and patterning a polysilicon layer, as is well known in the art. An LDD implant 124 is then performed to create the shallow source/drain regions laterally aligned to the gate electrodes 122. The resulting structure is illustrated in FIG. 2F, which shows LDD regions 130 formed in the active areas 103 within the substrate 100, and on both sides of each gate electrode 122. Continuing with the process flow, a conformal layer 132 such as a silicon nitride layer (i.e., a "nitride" layer) may be applied to the exposed surfaces of the semiconductor body, and in particular, to the sides of the gate electrodes 122, to provide a self-aligning mask for the heavy source/drain implant 134. Such a conformal layer 132 may preferably be formed to a thickness of 100–300 Å, and may alternatively be formed of silicon oxynitride (SiON) instead of silicon nitride. As shown in FIG. 2G, deep source/drain regions 140 are formed laterally aligned to the conformal layer 132 on the sides of the gate electrodes 122.

Additional processing steps may be incorporated to fabricate other types of devices, and further to provide one or more electrical interconnect layers for connecting the various devices into useful circuits. Such steps are outside the scope of this invention, are well known in the art, and are consequently not discussed in detail here.

Figure 3A:
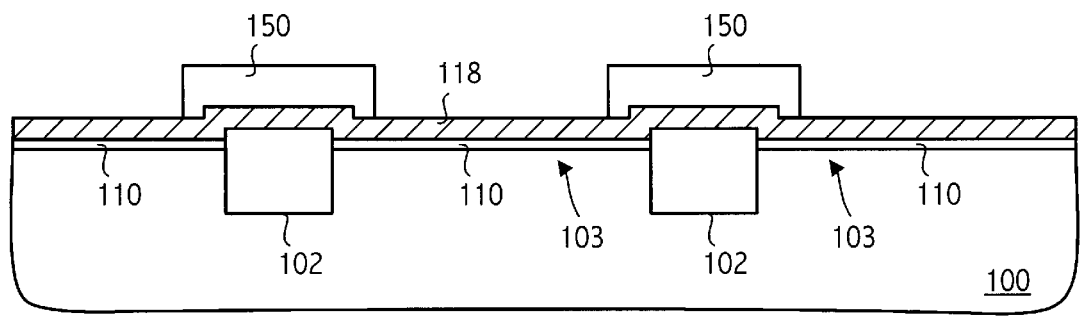
FIGS. 3A–3D are a sequence of cross-sections of a semiconductor body illustrating an improved semiconductor process flow, in accordance with another embodiment of the present invention, for creating a trench isolation region.

FIGS. 3A–3D are a sequence of cross-sections of a semiconductor body illustrating another embodiment of the present invention, which follows in sequence beginning after FIG, 2C. Referring now to FIG. 3A, a photoresist layer is deposited upon the polysilicon layer 118 and patterned slightly larger than the trench isolation regions, so that the polysilicon covering the trench isolation regions is itself covered and protected by the patterned photoresist 150. The polysilicon layer is then etched to expose the pad oxide 110 over the active areas 103, without subjecting the polysilicon over the trench isolation regions to any of the etchant.

Figure 3B:
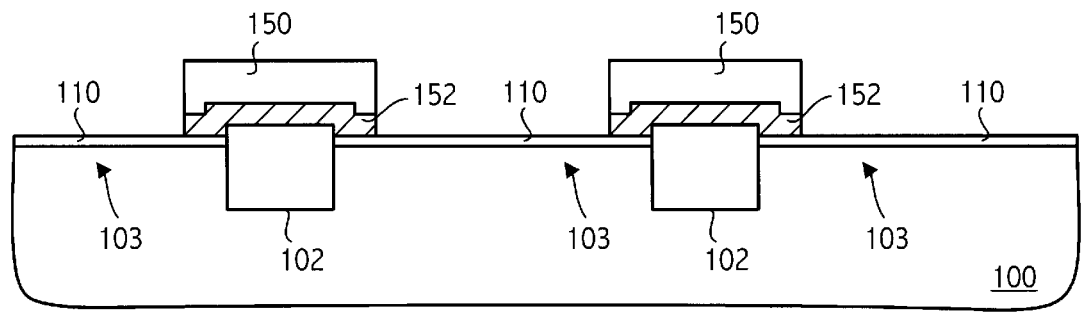
Figure 3C:
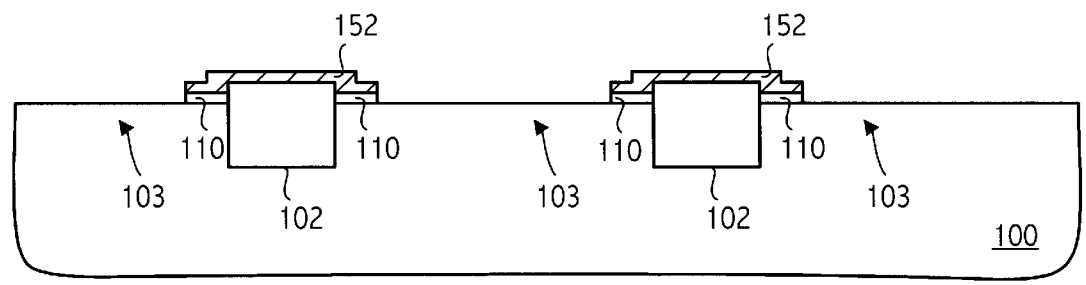

The resulting structure is shown in FIG. 3B, which shows the pad oxide 110 exposed over the large portion of the active area 103, and shows the formation of polysilicon "stripes" 152 still covering the trench isolation regions 102. The patterned photoresist 150 is then removed to expose the surface of the polysilicon stripes 152. An optional $NH_3$ anneal may be performed to create a nitrided polysilicon surface of the polysilicon stripes 152. Such an anneal may be advantageously performed at a temperature of 800–1000° C. for a time between 10–30 seconds. The process flow continues with the removal of the exposed portions of the pad oxide layer 110 over the active areas 103. The resulting structure is shown in FIG. 3C, which shows the active area 103 ready for gate dielectric formation. The remaining portions of the pad oxide layer 110 lie adjacent to the trench isolation regions 102, and both are protected by polysilicon stripes 152.

Figure 3D:
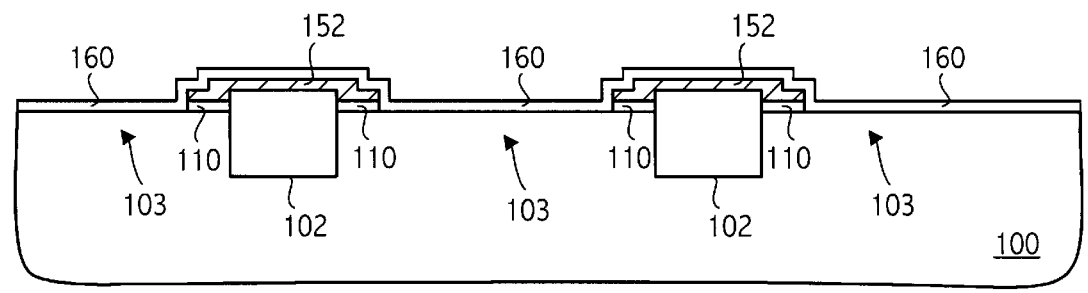

At this point of the process flow a gate dielectric layer may be formed on the surface of the active areas 103. For example, an oxidation may be performed to grow a 20 Å oxide 160 which provides the gate dielectric for transistors to be later formed within the active areas 103. Such a gate oxidation also converts to an oxide an upper portion (e.g., 10–20 Å) of the polysilicon stripes 152 (also labeled as 160). The resulting structure is shown in FIG. 3D. After formation of polysilicon gate electrodes over the gate oxide 160 within the active areas 103 (not shown), an additional oxidation may be performed to convert the remaining portion of the polysilicon stripes 152 to an oxide. Alternately, since the polysilicon stripes 152 are "encased" in oxide, they may be left as unconverted polysilicon.

The above process sequences portray that portion of a semiconductor process flow relevant to and necessary to understand the present invention. Other details, such as formation of CMOS wells, selective implants to achieve multiple transistor threshold voltages, plug via formation, local interconnect, formation of the above within epitaxial layers, and others, may be incorporated with the invention described herein to achieve other useful structures.

The present invention achieves a dense oxide above the trench isolation regions which is more robust against leakage currents across the trench isolation region.

Although only a small portion of a semiconductor body has been shown for purposes of illustration, it is understood that in actual practice, many devices are fabricated on a single semiconductor wafer as widely practiced in the art.

Accordingly, the invention is well-suited for use in an integrated circuit chip, as well as an electronic system including a microprocessor, a memory, and a system bus.

Those skilled in the art will readily implement the steps necessary to provide the structures and methods disclosed herein, and will understand that the process parameters, materials, and dimensions are given by way of example only and can be varied to achieve the desired structure as well as modifications which are within the scope of the invention.

While the invention has been largely described with respect to the embodiments set forth above, the invention is not necessarily limited to these embodiments. Variations and modifications of the embodiments disclosed herein may be made based on the description set forth herein, without departing from the scope and spirit of the invention as set forth in the following claims. For example, the invention is not necessarily limited to any particular transistor process technology, or to any particular layer thickness or composition. Accordingly, other embodiments, variations, and improvements not described herein are not necessarily excluded from the scope of the invention, which is defined by the following appended claims.

What is claimed is:

1. A method of forming an integrated circuit structure upon a semiconductor substrate having a top surface, said method comprising:
    forming a plurality of trench isolation regions, each filled with a trench dielectric material, at the top surface of the semiconductor substrate, said trench isolation regions defining active area regions therebetween;
    forming a protective layer over and fully covering the trench isolation regions and not in direct contact with the semiconductor substrate within the active area regions; and then
    exposing the top surface of the semiconductor substrate within the active area regions;
    wherein said protective layer remains over the trench isolation regions during at least a portion of the exposing step to protect the trench isolation regions and to reduce removal of trench dielectric material during the exposing step; and then
    forming a gate dielectric layer on the exposed top surface within the active area regions; and
    forming a gate electrode over the gate dielectric layer within an active area region; wherein the protective layer comprises a polysilicon layer.

2. A method as recited in claim 1 wherein the polysilicon layer is formed over the entire surface of the semiconductor body.

3. A method as recited in claim 1 wherein portions of the polysilicon layer overlying the active areas are removed prior to the gate dielectric layer forming step, while keeping the trench isolation regions fully covered by remaining portions of the polysilicon layer.

4. A method as recited in claim 1 wherein the protective layer forming step comprises:
    depositing a polysilicon layer over and fully covering the trench isolation regions; and
    converting at least an upper portion of the polysilicon layer to a resultant dielectric layer overlying the trench isolation regions.

5. A method as recited in claim 4 wherein the polysilicon layer is fully converted to form the resultant dielectric layer overlying the trench isolation region.

6. A method as recited in claim 4 wherein the deposited polysilicon layer is deposited directly onto the trench dielectric material.

7. A method as recited in claim 4 wherein the trench isolation material comprises TEOS.

8. A method as recited in claim 4 wherein the converting step includes forming a nitrogen-bearing layer within an upper portion of the resultant dielectric layer.

9. A method as recited in claim 4 wherein the converting step includes oxidation in a nitrogen-bearing ambient.

10. A method as recited in claim 4 wherein the converting step includes a rapid thermal anneal in a nitrogen-bearing ambient.

11. A method as recited in claim 10 wherein the nitrogen-bearing ambient includes $NH_3$.

12. A method as recited in claim 4 wherein the polysilicon deposition step is performed in a nitrogen-bearing ambient.

13. A method as recited in claim 4 wherein the converting step includes a plasma treatment in a nitrogen-bearing ambient to form a nitrogen bearing layer within the converted polysilicon layer.

14. A method as recited in claim 8 wherein the resultant nitrogen-bearing layer is 3–5% nitrogen within the top 50 angstroms of the nitrogen-bearing layer.

15. A method as recited in claim 3 wherein the remaining portions of the polysilicon layer covering the trench isolation regions extend onto the top surface of the active area regions.

16. A method of forming an integrated circuit structure upon a semiconductor substrate having a top surface, said method comprising the steps of:
    forming a plurality of trench isolation regions at the top surface of the semiconductor substrate, said trench isolation regions filled with a trench dielectric material and defining active area regions therebetween;
    forming at least over the trench isolation regions a protective layer comprising a polysilicon layer at least partially converted to an oxide layer; and then
    exposing the top surface of the semiconductor substrate within the active area regions; and then
    forming a gate dielectric layer on the exposed top surface within the active area regions;
    forming a gate electrode over the gate dielectric layer within an active area region; and
    forming source/drain regions associated with the gate electrode which are electrically isolated from any portion of the protective layer which may remain over the trench isolation regions.

17. The method as recited in claim 16 wherein the protective layer comprises a fully converted polysilicon layer.

18. The method as recited in claim 16 wherein the protective layer forming step comprises forming a polysilicon layer over the entire surface of the semiconductor body.

19. The method as recited in claim 16 wherein the exposing step comprises removing portions of the protective layer overlying the active area regions while keeping the trench isolation regions fully covered by remaining portions of the protective layer.

20. The method as recited in claim 18 wherein the protective layer forming step further comprises:
    converting at least an upper portion of the polysilicon layer to form a resultant dielectric layer at least overlying the trench isolation regions.

21. The method as recited in claim 20 wherein the converting step comprises fully converting the polysilicon layer to form the resultant dielectric layer at least overlying the trench isolation regions.

22. The method as recited in claim 20 wherein the polysilicon layer is chemical-vapor deposited directly onto the trench dielectric material.

23. The method as recited in claim 20 wherein the trench isolation material comprises TEOS.

24. The method as recited in claim 20 wherein the converting step includes forming a nitrogen-bearing layer within an upper portion of the resultant dielectric layer.

25. The method as recited in claim 20 wherein the converting step includes oxidizing the polysilicon layer in a nitrogen-bearing ambient.

26. The method as recited in claim 20 wherein the converting step includes a rapid thermal anneal in a nitrogen-bearing ambient.

27. The method as recited in claim 20 wherein the converting step includes a plasma treatment in a nitrogen-bearing ambient to form a nitrogen bearing layer within the converted polysilicon layer.

28. The method as recited in claim 19 wherein, after the exposing step, the protective layer covering the trench isolation regions extends partially over the active area regions.

29. A method of forming an integrated circuit structure upon a semiconductor substrate having a top surface, said method comprising:

forming a plurality of trench isolation regions at the top surface of the semiconductor substrate, said trench isolation regions filled with a trench dielectric material and defining active area regions therebetween;

forming a polysilicon layer over both active area regions and trench isolation regions;

converting at least a portion of the polysilicon layer into an oxide layer at least overlying the trench isolation regions; and then etching the converted polysilicon layer and any remaining polysilicon layer which together overly the active area regions to expose the top surface of the active area regions; and then forming transistors within the exposed active area regions having drain/source terminals electrically isolated from any remaining polysilicon layer overlying the trench isolation regions.

30. The method as recited in claim 29 wherein, after the etching step, the trench isolation regions remain covered by at least some portions of the polysilicon or converted polysilicon layer.

31. The method as recited in claim 29 wherein the converting step comprises fully converting the polysilicon layer to form a resultant dielectric layer at least overlying the trench isolation regions.

32. The method as recited in claim 29 wherein the polysilicon layer is chemical-vapor deposited directly onto the trench dielectric material.

33. The method as recited in claim 29 wherein the trench isolation material comprises TEOS.

34. The method as recited in claim 29 wherein the converting step includes forming a nitrogen-bearing layer within an upper portion of the resultant dielectric layer.

35. The method as recited in claim 29 wherein, after the exposing step, the protective layer covering the trench isolation regions extends partially over the active area regions.

36. A method of forming an integrated circuit structure upon a semiconductor substrate having a top surface, said method comprising:

forming a plurality of trench isolation regions at the top surface of the semiconductor substrate, said trench isolation regions filled with a trench dielectric material and defining active area regions therebetween;

forming a polysilicon layer on the surface of the substrate over the trench isolation regions and over; but not in direct contact with, the active area regions, converting the polysilicon layer into an oxide layer; and then etching the converted polysilicon layer overlying the active area regions to expose the top surface of the active area regions; and then forming a transistor gate dielectric layer on the exposed top surface within the active area regions;

forming transistor gate electrodes over the gate dielectric layer within the active area regions.

37. The method as recited in claim 36 wherein the polysilicon layer is formed in direct contact with the trench isolation material forming the trench isolation areas.

38. The method as recited in claim 36 wherein the converted polysilicon layer over the trench isolation regions is fully removed by the etching step.

39. The method as recited in claim 36 wherein at least a portion of the converted polysilicon layer over the trench isolation regions remains after the etching step.

40. The method as recited in claim 36 wherein the polysilicon layer is chemical-vapor deposited directly onto the trench dielectric material.

41. The method as recited in claim 36 wherein the trench isolation material comprises TEOS.

42. The method as recited in claim 36 wherein the converting step includes forming a nitrogen-bearing layer within an upper portion of the resultant dielectric layer.

43. The method as recited in claim 36 wherein, after the etching step, the converted polysilicon layer covering the trench isolation regions extends partially over the active area regions.

* * * * *

UNITED STATES PATENT AND TRADEMARK OFFICE
CERTIFICATE OF CORRECTION

PATENT NO.     : 6,403,445 B1
DATED          : June 11, 2002
INVENTOR(S)    : Mark I. Gardner et al.

It is certified that error appears in the above-identified patent and that said Letters Patent is hereby corrected as shown below:

<u>Column 7,</u>
Lines 16 –19, please replace claim 28, with the following:
-- 28. The method as recited in claim 18 wherein, after the exposing step, the protective layer covering the trench isolation regions extends partially over the active area regions.--

Signed and Sealed this

Twenty-fifth Day of February, 2003

JAMES E. ROGAN
*Director of the United States Patent and Trademark Office*